US010425094B2

(12) United States Patent
Traeber (10) Patent No.: US 10,425,094 B2
(45) Date of Patent: Sep. 24, 2019

(54) METHOD AND APPARATUS FOR PREVENTING INHERENT ERROR PROPAGATION OF SUCCESSIVE APPROXIMATION REGISTER ANALOG-TO-DIGITAL CONVERTER THROUGH DIGITAL CORRECTION

(71) Applicant: Intel Corporation, Santa Clara, CA (US)

(72) Inventor: Mario Traeber, Singapore (SG)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/001,991

(22) Filed: Jun. 7, 2018

(65) Prior Publication Data

US 2019/0044529 A1      Feb. 7, 2019

Related U.S. Application Data

(60) Provisional application No. 62/593,282, filed on Dec. 1, 2017.

(51) Int. Cl.
*H03M 1/10*      (2006.01)
*H03M 1/06*      (2006.01)
*H03M 1/46*      (2006.01)

(52) U.S. Cl.
CPC ....... *H03M 1/1071* (2013.01); *H03M 1/0602* (2013.01); *H03M 1/462* (2013.01)

(58) Field of Classification Search
CPC .......................... H03M 1/1071; H03M 1/0602
USPC ................................................. 341/118, 155
See application file for complete search history.

(56) References Cited

U.S. PATENT DOCUMENTS

| 5,153,592 | A  | * | 10/1992 | Fairchild ............. | H03M 1/1047 341/118 |
| 7,250,896 | B1 |   | 7/2007  | Hesener                |                     |
| 9,397,679 | B1 | * | 7/2016  | Harpe .................. | H03M 1/1033        |
| 9,484,945 | B1 | * | 11/2016 | Wan ........................ | H03M 1/46       |
| 9,859,907 | B1 | * | 1/2018  | Li ......................... | H03M 1/0617     |

(Continued)

OTHER PUBLICATIONS https://en.wikipedia.org/wiki/Successive_approximation_ADC, Date Unknown.

(Continued)

*Primary Examiner* — Lam T Mai
(74) *Attorney, Agent, or Firm* — 2SPL Patent Attorneys PartG mbB; Yong Beom Hwang (57) ABSTRACT

A method and apparatus for preventing inherent error propagation of a successive approximation register (SAR)-based analog-to-digital converter (ADC) through digital correction. A sample-and-hold circuit captures an input analog signal and generates a hold sample of the input analog signal. A digital-to-analog converter (DAC) generates an iterative sample corresponding to a digital code for each iteration. A comparator compares the hold sample and the iterative sample and generates a decision signal based on the comparison. A successive approximation register updates the digital code for each iteration based on the decision signal and supplies the updated digital code to the DAC. The SAR ADC includes an error detection circuit to detect an error condition. A controller ceases iteration operation if the error condition is detected and outputs the current digital code as a result.

14 Claims, 4 Drawing Sheets

(56) References Cited

U.S. PATENT DOCUMENTS

| | | | | |
|---|---|---|---|---|
| 9,912,343 B1 * | 3/2018 | Li | ............... | H03M 1/1009 |
| 10,027,339 B2 * | 7/2018 | Ding | ............... | H03M 1/1033 |
| 10,044,364 B1 * | 8/2018 | Sharif | ............... | H03M 1/38 |
| 10,050,638 B2 * | 8/2018 | Ding | ............... | H03M 1/1009 |
| 10,128,862 B2 * | 11/2018 | Liu | ............... | H03M 1/1009 |
| 10,187,079 B1 * | 1/2019 | Sharif | ............... | H03M 1/468 |
| 2003/0052809 A1 | 3/2003 | Kuttner | | |

OTHER PUBLICATIONS https://www.maximintegrated.com/en/app-notes/index.mvp/id/1080, Date Unknown.
https://en.wikipedia.org/wiki/Successive_approximation_ADC.
https://www.maximintegrated.com/en/app-notes/index.mvp/id/1080.

* cited by examiner

METHOD AND APPARATUS FOR PREVENTING INHERENT ERROR PROPAGATION OF SUCCESSIVE APPROXIMATION REGISTER ANALOG-TO-DIGITAL CONVERTER THROUGH DIGITAL CORRECTION

CROSS REFERENCE TO RELATED APPLICATIONS

This application claims priority under 35 U.S.C. § 119(e) to U.S. provisional application No. 62/593,282, entitled "Successive approximation register-based analog-to-digital converter" and filed Dec. 1, 2017, which is incorporated by reference as if fully set forth herein.

FIELD

Examples relate to a successive approximation register (SAR)-based analog-to-digital converter (ADC), more particularly, to a method and apparatus for preventing inherent error propagation of an SAR ADC through digital correction.

BACKGROUND

An SAR ADC is a type of ADC that converts an analog input signal into a digital representation by implementing a binary search algorithm. Via the binary search through possible quantization levels, the SAR ADC converges upon a digital output. An SAR ADC has been used for medium-to-high-resolution applications.

While the internal circuitry of the SAR ADC may be running at high frequency, the ADC sample rate is a fraction of that frequency due to the successive approximation algorithm. The resolution of SAR ADCs most commonly ranges from 8 to 16 bits, and they provide low power consumption as well as a small form factor. These features make the SAR ADCs desirable for a wide variety of applications, including mobile phones, etc.

Due to its benefits of high performance (e.g. achievable resolution and precision), low power consumption as well as low footprint, SAR ADCs became more and more popular in a communication system. The main disadvantage of the SAR ADCs is the limitation of the sampling frequency. This is due to the iterative nature of the SAR ADCs that convert one bit per cycle. The SAR ADC architectures require a clock frequency as follows:

$$F_{clock} > R \times F_{sample},$$

where $F_{clock}$ is the operational clock frequency, R is the resolution of the SAR ADC in bits, and $F_{sample}$ is the conversion or sampling frequency. In current deep submicron technologies, $F_{clock}$ of 1 GHz is achievable, which means that for common precision requirements of 10 to 12 bits, a sampling frequency of 50 MHz is possible. Through time-interleaving this can be up-tuned by 2× or 4×, respectively, making this concept ideal for communication systems.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
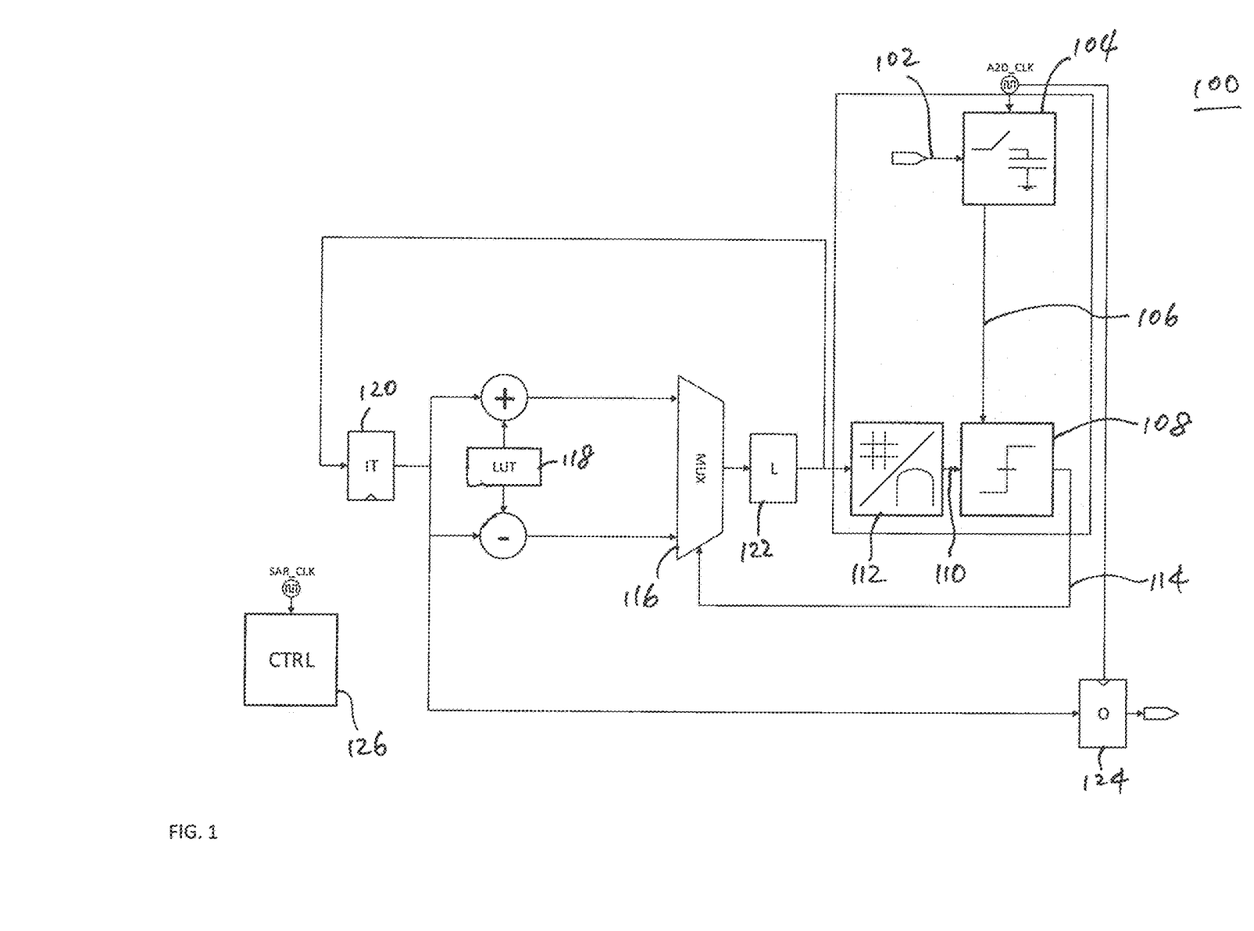
FIG. 1 is a block diagram of an example SAR ADC.

FIG. 1 is a block diagram of an example SAR ADC 100. An analog part of the SAR ADC 100 is shaded in FIG. 1. An input signal 102 enters a sample-and-hold circuit 104. The sample-and-hold circuit 104 is clocked with a clock (A2D_CLK) with a sampling frequency. The sample-and-hold circuit 104 provides a hold sample 106 of the analog input signal to a comparator 108. The comparator 108 is an analog comparator that compares the hold sample 106 with an iterative sample 110 provided by an internal digital-to-analog converter (DAC) 112. The comparator 108 generates a decision signal 114, which is either logic 1 or logic 0 based on the comparison result, (e.g. generates a logic 0 signal if the instantaneous iterative sample 116 provided by the DAC 112 is lower than the hold sample 106, and a logic 1 signal otherwise). The decision signal 114 from the comparator 108 selects an output of a multiplexer 116, which determines the iteration value (a digital code) for the next iteration. For example, a look-up table 118 may provide a weight which is added to, and subtracted from, the current iteration value that is stored in the iteration register 120 to form two possible values (digital code candidates) to be selected at the multiplexer 116. If the decision signal 114 indicates that the current value stored in the iteration register 120 is too low (logic 0) a larger value (i.e. the current iteration value plus the weight) will be selected, and if the decision signal 114 indicates that the current value stored in the iteration register 120 is too high (logic 1) a smaller value (i.e. the current iteration value minus the weight) will be selected. This new iteration value output from the multiplexer 116 may be held in a latch 122 before being sent to the DAC 112 for generating the instantaneous iterative sample 110. The latch 122 is to keep the analog circuitry more stable for improved performance. The output register 124 holds the current value and outputs a final digital code.

A control block 126 is clocked by the operational clock (SAR_CLK). The frequency of the SAR_CLK is an integer multiple frequency of the A2D_CLK according to the above relationship f(SAR_CLK)>R×f(A2D_CLK), where R is the resolution in bits. The output register 124 and the sample-and-hold circuit 104 are clocked by the A2D_CLK and other sequential elements of the SAR ADC 100 and the controller 126 are clocked by the SAR_CLK. The controller 126 manages the reset of the sequential logic for each iteration of the A2D_CLK and the update into the output register 124 as well as the pointer logic (counter) into the look-up table 118.

Besides all the benefits of power, performance, and area of the SAR ADC architecture, the example SAR ADC in FIG. 1 has design constraints especially when getting closer to the technology limits, i.e. for higher resolutions at higher sampling clocks, e.g. for $F_{clock}$>1 GHz. The decision of the comparator 108 is improperly modeled if only logic 1 or logic 0 is assumed. In fact, the nature of the SAR ADC algorithm is to iteratively converge to the analog hold sample 106 with the DAC output 110. As these two values get closer, the differential voltage for the comparator 108 becomes smaller. As the differential voltage for the comparator 108 becomes smaller, it takes longer for the comparator 108 to make a decision signal 114 which is firmly logic 1 or logic 0.

In that case, the comparator 108 may become metastable and float its decision. The decision signal 114 made by the comparator 108 in such cases can become neither logic 1 nor logic 0. Therefore, the logic level alphabet of the comparator 108 needs to be extended to model those cases. For example, additional states, such as logic U (for unknown) or logic M (for metastable), may be introduced.

With the decision signal 114 of the comparator 108 being fed back into a digital circuitry with multi-bit processing on the adders, subtractors, multiplexors and registers/latches, this can cause timing (setup and/or hold) violations which can lead to arbitrary (random in nature) values as feedback candidates into the iteration register 120. Once the iteration register 120 intakes a random value the remaining conversion cycles may not be able to catch up with the amplitude error. In general, an SAR ADC 100 is dimensioned with the values in the look-up table 118 such that one of the decisions of the comparator 108 can be wrong using amplitude redundancy, as long as the decision is firmly wrong, e.g. logic 1 where it should have been logic 0, and vice versa. In more generalized cases, when considering decisions of logic U or logic M (though infrequent) happening, this does not hold true anymore and one can observe larger signal errors in the form of spikes.

For a properly dimensioned SAR ADC such error events occur very seldom in a general case. However, considering an error every 1 billion samples would lead to measurable bit error rates, depending on the throughput of the communication system this can be too frequent for practical cases and not all communication systems would be able to tolerate such errors.

This problem may be addressed by probabilistic means. For example, the comparator 108 may be heavily overdesigned using larger currents to shift the probability down. However, it can still be shown that this effect is frequent enough to be measurable. A communication system may not tolerate a bit error in a day to a week or so. Increasing the operating current further leads to commercially unattractive power, performance, and area metrics and thus may not be a good solution to the problem.

Other solutions may be to qualify the comparator decision 114 by introducing yet another signal which is defining if the decision is ready or not. However, this, in fact, moves the problem from the decision signal 114 to the qualifying signal. Additional timing margin should be reserved to cater for a solid overlap to make practical solutions possible. This can jeopardize the most crucial design element, i.e. the timing budget for the comparator, which in itself normally defines the performance metric for the SAR ADC.

The above problem may be circumvented by being asynchronous and waiting as long as the comparator 108 possibly might need. However, this leads to non-deterministic iteration timings which poses other side effects and much harder design and sign-off process.

The examples disclosed herein solve the problem discussed above by means of an error detection and correction which is holistic in nature and release design constraints from the comparator.

The example SAR ADCs disclosed herein utilize two facts to improve its operation. Firstly, once the comparator is indecisive, the current digital code in the iteration register is very close to the desired digital representation of the analog input signal. Therefore, in that situation, the operation of the SAR ADC may be ceased and the iteration may stop, and the digital code of the previous iteration cycle as stored in the iteration register 120 may be sent as an output value by latching it into the output register 124.

Secondly, exploiting the above condition, if the comparator output is logic 1 or logic 0 (i.e. the two expected/desired comparator outputs) the iteration register would be updated to one of the two possible candidate values (as preset as inputs to the multiplexer 116) in the next cycle which may be the iteration register value plus and minus the weight. If the iteration register was not updated in that subsequent cycle with one of these two values it can be said that the comparator decision took up a non-decisive logic value (e.g. logic M or logic U) as a cause and thus it can be decided to cease the iteration operation of the SAR ADC and the digital code in the iteration register may be sent as an output value.

In examples, the SAR ADC includes means for detecting such error conditions of the SAR ADC (e.g. if the comparator outputs an indecisive value, or if the iteration register is updated with a value that is not expected from the previous iteration value, etc.) and a controller may cease the iteration operation of the SAR ADC and may output the previous iteration register value as an output.

Figure 2:
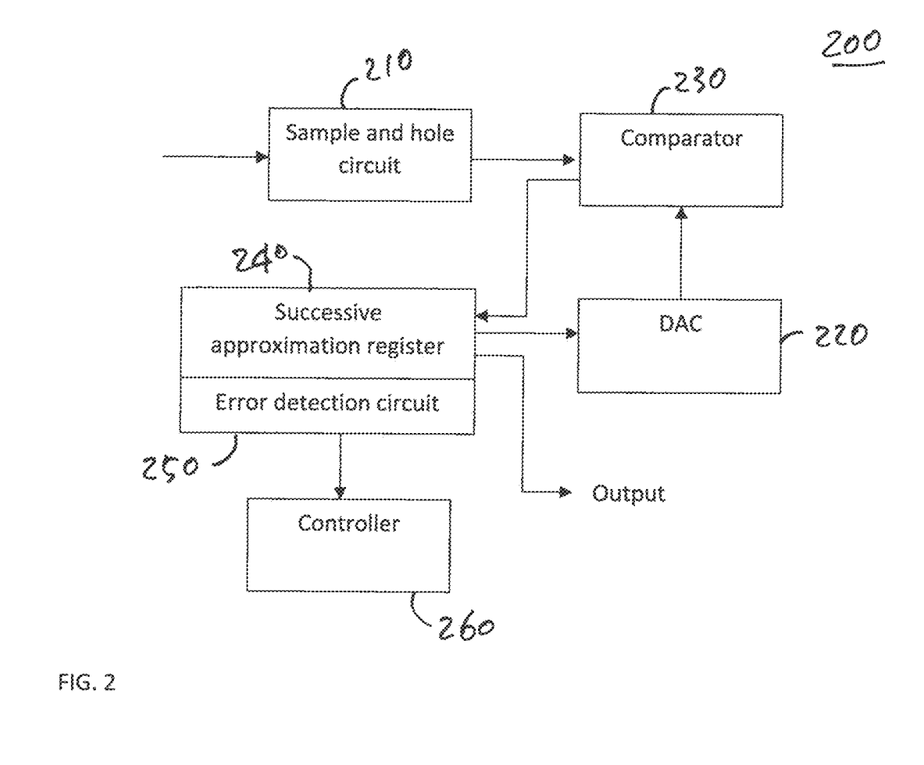
FIG. 2 is a block diagram of an example SAR ADC.

FIG. 2 is a schematic block diagram of an example SAR ADC 200. The SAR ADC 200 includes a sample-and-hold circuit 210, a DAC 220, a comparator 230, a successive approximation register 240, an error detection circuit 250, and a controller 260. The sample-and-hold circuit 210 is configured to capture an input analog signal and generate a hold sample of the input analog signal. The DAC 220 is configured to generate an iterative sample corresponding to a digital code. The comparator 230 is configured to compare the hold sample and the iterative sample and generate a decision signal based on the comparison. The successive approximation register 240 is configured to update the digital code for each iteration based on the decision signal and supply the updated digital code to the DAC 220. The error detection circuit 250 is configured to detect an error condition (e.g. if the comparator outputs an indecisive value, or if the iteration register is updated with a value that is not expected from the previous iteration value, etc.) in the operation of the SAR ADC (e.g. based on digital codes before and after update). The controller 260 is configured to cease the iteration operation and output a digital code in a previous iteration as a result if the error condition is detected.

Figure 3:
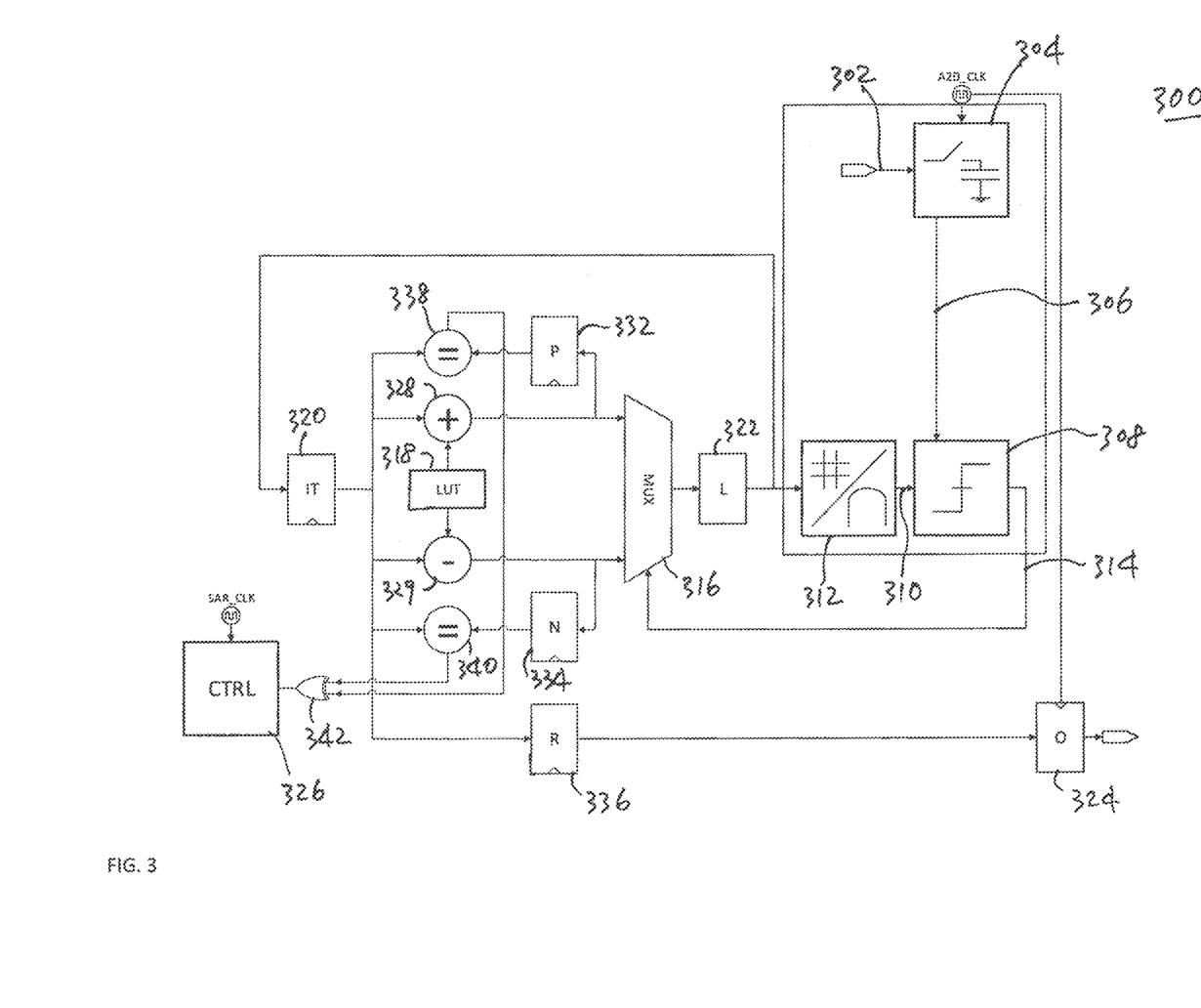
FIG. 3 is a block diagram of an example SAR ADC in accordance with one aspect.

FIG. 3 is a block diagram of an example SAR ADC 300 according to one aspect. An analog input signal 302 enters a sample-and-hold circuit 304. The sample-and-hold circuit 304 is clocked with the A2D_CLK. The sample-and-hold circuit 304 provides a hold sample 306 of an analog input signal 302 to a comparator 308. The comparator 308 compares the hold sample 306 with an iterative sample 310 provided by an internal DAC 312. The comparator 308 makes a decision signal 314, which is either logic 1 or logic 0 based on the comparison result, (e.g. logic 0 if the instantaneous iterative sample 310 provided by the DAC 312 is lower than the hold sample 306, and logic 1 otherwise). The decision signal 314 from the comparator 308 is sent to a multiplexer 316 and a multiplexer output is selected based on the decision signal 314. The multiplexer output may be stored in a latch 322 before being sent to the DAC 312. The multiplexer output is sent to the DAC 312 for generating the iterative sample 310. The multiplexer output is also sent the iteration register 320 to update the iteration register 320.

In some examples, the SAR ADC 300 may include a look-up table 318 for providing a weight. The weight is added to, and subtracted from, the current iteration value by an adder 328 and a subtractor 329, respectively. The current iteration value plus and minus the weight form the two update candidates to be selected by the multiplexer 316 for the next iteration. If the decision signal 314 indicates that the current value stored in the iteration register 320 is too low (logic 0), a larger value (i.e. the iteration value plus the weight) is selected, and if the decision signal 314 indicates that the current value stored in the iteration register 320 is too high (logic 1), a smaller value (i.e. the iteration value minus the weight) is selected. As explained above, this new iteration value is held in the latch 322 before being sent to the DAC 312 and to the iteration register 320. The latch 322 is to keep the analog circuitry more stable for improved performance. The output register 324 holds a final digital code as an output.

In some examples, the SAR ADC 300 may include error detection circuits. The error detection circuits may include update candidate registers 332, 334, logic equivalence gates 338, 340, and a logic gate 342 (e.g. an exclusive OR (XOR) gate, an OR gate, etc.). The update candidate registers 332, 334 are provided to store the positive and negative digital code update candidates (e.g. the iteration value plus and minus the weight provided by the look-up table 318) for each iteration, respectively. The update candidate registers 332, 334 are solely driven by signals which do not depend on the comparator decision signal 314.

At each iteration, as the decision signal 314 is issued from the comparator 308, the multiplexer 316 makes an output and the iteration register 320 is updated accordingly. It is determined whether the updated iteration register value is same as the values in the update candidate registers 332, 334, which were stored in the previous iteration, by logic equivalence gates 338, 340. The equivalence results are captured by the logic gate 342 (e.g. an XOR gate, an OR gate, etc.) and sent to the controller 326.

If one of the logic equivalence (=) yields logic 1 (alternatively logic 0) (e.g. the updated iteration register value is same as one of the update candidate register values), the controller 326 may continue the iteration operation of the SAR ADC 300. If none of the logic equivalence (=) yields logic 1 (alternatively logic 0) (e.g. the updated iteration register value is not same as one of the update candidate register values), the controller 326 may determine that the comparator 308 made a non-decisive value and cease the iteration operation of the SAR ADC 300 and may output the previous iteration value as a result to the output register. In order to store the previous iteration value, an additional result candidate register 336 may be provided, which feeds the SAR ADC output through the output register 324.

With this scheme, the implementation of the SAR ADC remains purely digital and keeps the absolutely synchronous logic. There is no change to the analog circuitry in the conventional SAR ADC. The comparator may be down-dimensioned, which can lead less operating current and reduced power consumption. The error detection logic may detect that the SAR ADC iteration gets close to the target and may abort the remaining conversion cycles. This can save the power as well. With the same comparator it would be possible to achieve higher target frequencies for SAR-_CLK since by means of the error detection/correction logic the timing requirements of the comparator can be relaxed. With the examples disclosed herein, error events are digitally countable for characterization and validation of the performance in the timing loop.

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

Figure 4:
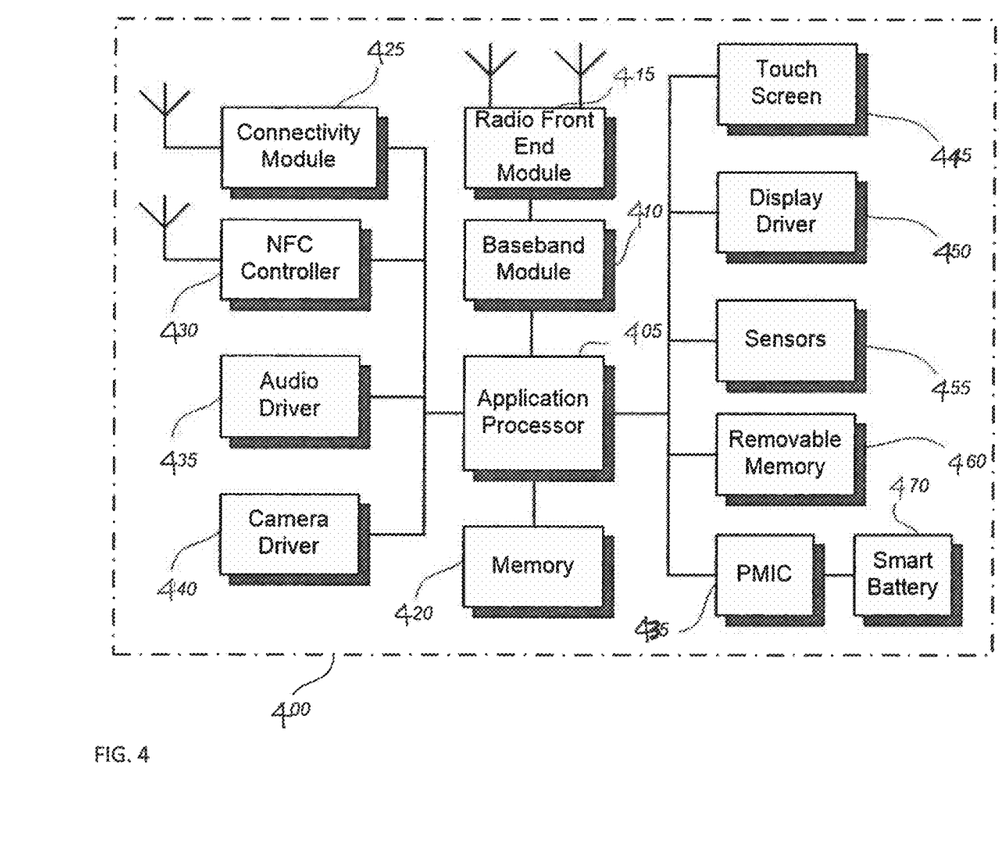
FIG. 4 illustrates a user device in accordance with an aspect.

The SAR ADC disclosed herein may be included in any device including a wireless communication device. The device may be a user device or a network device. FIG. 4 illustrates a user device 400 in accordance with an aspect. The user device 400 may be a mobile device (e.g. a smart phone, a laptop computer, a tablet computer, etc.) in some aspects and includes an application processor 405, baseband processor 410 (also referred to as a baseband module), radio front end module (RFEM) 415, memory 420, connectivity module 425, near field communication (NFC) controller 430, audio driver 435, camera driver 440, touch screen 445, display driver 450, sensors 455, removable memory 460, power management integrated circuit (PMIC) 465 and smart battery 470.

In some aspects, application processor 405 may include, for example, one or more CPU cores and one or more of cache memory, low drop-out voltage regulators (LDOs), interrupt controllers, serial interfaces such as serial peripheral interface (SPI), inter-integrated circuit (I2C) or universal programmable serial interface module, real time clock (RTC), timer-counters including interval and watchdog timers, general purpose input-output (TO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 410 may be implemented, for example, as a solder-down substrate including one or more integrated circuits, a single packaged integrated circuit soldered to a main circuit board, and/or a multi-chip module containing two or more integrated circuits.

The examples as described herein may be summarized as follows:

Example 1 is an SAR ADC. The SAR ADC includes a sample-and-hold circuit configured to capture an input analog signal and generate a hold sample of the input analog signal, a DAC configured to generate an iterative sample corresponding to a digital code, a comparator configured to compare the hold sample and the iterative sample and generate a decision signal based on the comparison, a successive approximation register configured to update the digital code for each iteration based on the decision signal and supply an updated digital code to the DAC, an error detection circuit configured to detect an error condition, and a controller configured to cease iteration operation if the error condition is detected.

Example 2 is the SAR ADC of example 1, wherein the error condition is detected if the comparator outputs an indecisive value.

Example 3 is the SAR ADC as in any one of examples 1-2, wherein the error condition is detected if an iteration register in the successive approximation register is updated with a value that is not expected from a previous iteration value.

Example 4 is the SAR ADC as in any one of examples 1-3, wherein the successive approximation register includes an iteration register for storing a digital code, a look-up table for generating a weight to be added to, and subtracted from, the digital code stored in the integration register to generate digital code candidates, and a multiplexer for outputting one of the digital code candidates to the DAC based on the decision signal, wherein the output from the multiplexer is sent to the iteration register.

Example 5 is the SAR ADC of example 4, wherein the successive approximation register includes a latch for latching an output of the multiplexer.

Example 6 is the SAR ADC as in any one of examples 4-5, wherein the error detection circuit includes candidate registers for storing the digital code candidates, and logic equivalence circuits for determining whether a digital code output from the iteration register is same as one of the digital code candidates for each iteration, wherein the controller ceases the iteration operation if the digital code output from the iteration register is not same as one of the digital code candidates.

Example 7 is the SAR ADC of example 6, wherein the error detection circuit includes a result candidate register for storing a digital code output from the iteration register, wherein a value stored in the result candidate register is output as a result if the error condition is detected.

Example 8 is a method for converting an analog signal to a digital signal. The method comprises capturing an input analog signal and generating a hold sample of the input analog signal, generating, by a DAC, an iterative sample corresponding to a digital code, comparing the hold sample and the iterative sample and generating a decision signal based on the comparison, updating the digital code for each iteration based on the decision signal, wherein the iterative sample is generated from the updated digital code in each iteration, detecting an error condition, and ceasing iteration operation if the error condition is detected.

Example 9 is the method of example 8, wherein the error condition is detected if the comparator outputs an indecisive value.

Example 10 is the method as in any one of examples 8-9, wherein the error condition is detected if an iteration register in the successive approximation register is updated with a value that is not expected from a previous iteration value.

Example 11 is the method as in any one of examples 8-10, further comprising storing the digital code and the updated digital code in an iteration register, generating a weight to be added to, and subtracted from, the digital code stored in the iteration register to generate digital code candidates, and outputting one of the digital code candidates to the DAC based on the decision signal.

Example 12 is the method of example 11, wherein the one of the digital code candidates is latched temporarily before being sent to the DAC.

Example 13 is the method as in any one of examples 11-12, wherein the error condition is detected if an updated digital code for a current iteration is not same as one of the digital code candidates.

Example 14 is the method as in any one of examples 11-13, wherein a digital code output from the iteration register is stored in a temporary register, and output as a result if the error condition is detected.

Example 15 is a non-transitory computer-readable storage for storing a code, when executed, to implement a method as in any one of examples 8-14.

Example 16 is an SAR ADC. The SAR ADC includes a capturing means for capturing an input analog signal and generating a hold sample of the input analog signal, a generating means for generating an iterative sample corresponding to a digital code, a comparing means for comparing the hold sample and the iterative sample and generating a decision signal based on the comparison, a updating means for updating the digital code for each iteration based on the decision signal and supplying an updated digital code to the means for generating, a detecting means for detecting an error condition, and a controlling means for ceasing iteration operation if the error condition is detected.

Example 17 is the SAR ADC of example 16, wherein the error condition is detected if the comparing means outputs an indecisive value.

Example 18 is the SAR ADC as in any one of examples 16-17, wherein the error condition is detected if an iteration register in the updating means is updated with a value that is not expected from a previous iteration value.

Example 19 is the SAR ADC as in any one of examples 16-18, wherein the updating means includes an iteration register for storing a digital code, a look-up table for generating a weight to be added to, and subtracted from, the digital code stored in the integration register to generate digital code candidates, and a multiplexer for outputting one of the digital code candidates to the generating means based on the decision signal, wherein the output from the multiplexer is sent to the iteration register.

Example 20 is the SAR ADC of example 19, wherein the updating means includes a latch for latching an output of the multiplexer.

Example 21 is the SAR ADC as in any one of examples 19-20, wherein the detecting means includes candidate registers for storing the digital code candidates, and logic equivalence circuits for determining whether a digital code output from the iteration register is same as one of the digital code candidates for each iteration, wherein the controlling means ceases the iteration operation if the digital code output from the iteration register is not same as one of the digital code candidates.

Example 22 is the SAR ADC of example 21, wherein the detecting means includes a result candidate register for storing a digital code output from the iteration register, wherein a value stored in the result candidate register is output as a result if the error condition is detected.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F) PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A successive approximation register (SAR) analog-to-digital converter (ADC), comprising:
a sample-and-hold circuit configured to capture an input analog signal and generate a hold sample of the input analog signal;
a digital-to-analog converter (DAC) configured to generate an iterative sample corresponding to a digital code;
a comparator configured to compare the hold sample and the iterative sample and generate a decision signal based on the comparison;
a successive approximation register configured to update the digital code for each iteration based on the decision signal and supply an updated digital code to the DAC;

an error detection circuit configured to detect an error condition; and a controller configured to cease iteration operation if the error condition is detected.

2. The SAR ADC of claim 1, wherein the error condition is detected if the comparator outputs an indecisive value.

3. The SAR ADC of claim 1, wherein the error condition is detected if an iteration register in the successive approximation register is updated with a value that is not expected from a previous iteration value.

4. The SAR ADC of claim 1, wherein the successive approximation register includes:

an iteration register for storing a digital code;

a look-up table for generating a weight to be added to, and subtracted from, the digital code stored in the integration register to generate digital code candidates; and a multiplexer for outputting one of the digital code candidates to the DAC based on the decision signal, wherein the output from the multiplexer is sent to the iteration register.

5. The SAR ADC of claim 4, wherein the successive approximation register includes a latch for latching an output of the multiplexer.

6. The SAR ADC of claim 4, wherein the error detection circuit includes:

candidate registers for storing the digital code candidates; and logic equivalence circuits for determining whether a digital code output from the iteration register is same as one of the digital code candidates for each iteration, wherein the controller ceases the iteration operation if the digital code output from the iteration register is not same as one of the digital code candidates.

7. The SAR ADC of claim 6, wherein the error detection circuit includes a result candidate register for storing a digital code output from the iteration register, wherein a value stored in the result candidate register is output as a result if the error condition is detected.

8. A method for converting an analog signal to a digital signal, comprising:

capturing an input analog signal and generating a hold sample of the input analog signal;

generating, by a digital-to-analog converter (DAC), an iterative sample corresponding to a digital code;

comparing the hold sample and the iterative sample and generating a decision signal based on the comparison;

updating the digital code for each iteration based on the decision signal, wherein the iterative sample is generated from the updated digital code in each iteration;

detecting an error condition; and ceasing iteration operation if the error condition is detected.

9. The method of claim 8, wherein the error condition is detected if the comparator outputs an indecisive value.

10. The method of claim 8, wherein the error condition is detected if an iteration register in the successive approximation register is updated with a value that is not expected from a previous iteration value.

11. The method of claim 8, further comprising:

storing the digital code and the updated digital code in an iteration register;

generating a weight to be added to, and subtracted from, the digital code stored in the iteration register to generate digital code candidates; and outputting one of the digital code candidates to the DAC based on the decision signal.

12. The method of claim 11, wherein the one of the digital code candidates is latched temporarily before being sent to the DAC.

13. The method of claim 11, wherein the error condition is detected if an updated digital code for a current iteration is not same as one of the digital code candidates.

14. The method of claim 11, wherein a digital code output from the iteration register is stored in a temporary register, and output as a result if the error condition is detected.

* * * * *